(12) United States Patent
Christensen

(10) Patent No.: US 7,243,296 B2
(45) Date of Patent: Jul. 10, 2007

(54) METHOD OF FORWARD ERROR CORRECTION

(75) Inventor: Carl Christensen, South Jordan, UT (US)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 10/518,226

(22) PCT Filed: Jun. 17, 2003

(86) PCT No.: PCT/US03/19154

§ 371 (c)(1),
(2), (4) Date: Dec. 16, 2004

(87) PCT Pub. No.: WO04/001976

PCT Pub. Date: Dec. 31, 2003

(65) Prior Publication Data

US 2005/0193319 A1 Sep. 1, 2005

Related U.S. Application Data

(60) Provisional application No. 60/390,842, filed on Jun. 21, 2002.

(51) Int. Cl.
G06F 11/00 (2006.01)
H03M 13/00 (2006.01)
(52) U.S. Cl. ................... 714/800; 714/804; 714/758
(58) Field of Classification Search .............. None
See application file for complete search history.

(56) References Cited

U.S. PATENT DOCUMENTS 4,364,081 A 12/1982 Hashimoto et al.
4,417,339 A * 11/1983 Cantarella .............. 714/777
4,660,202 A 4/1987 Woodsum
4,760,576 A 7/1988 Sako
4,796,261 A 1/1989 Moriwaki
5,392,299 A 2/1995 Rhines et al.
5,412,667 A 5/1995 Havemose
5,450,421 A 9/1995 Joo et al.
5,559,506 A 9/1996 Leitch
5,699,062 A 12/1997 Widmer
5,740,186 A 4/1998 Widmer
6,029,266 A 2/2000 Lee
6,065,147 A 5/2000 Pyndiah et al.

(Continued)

OTHER PUBLICATIONS

Supplementary European Search Report.

Primary Examiner—Christine T. Tu
(74) Attorney, Agent, or Firm—Joseph J. Laks; Jeffrey M. Navon; Brian J. Dorini

(57) ABSTRACT

An iterative method of correcting errors in a data block. Bad bytes are first identified using information derived from an 8B/10B decoding of the data block. Within each identified bad byte, suspect bits are subsequently identified using information derived from parity decoding of a row of the data block. Each suspect bit is then classified as either a confirmed error bit or an unconfirmed error bit using information derived from parity decoding of a column of the data block in which the suspect bit is located. Confirmed error bits are then corrected, the parity bits corresponding to the confirmed error bit reset, and the bad byte cleared. The process is then repeated if one or more bad bytes remain in the data block.

30 Claims, 7 Drawing Sheets

U.S. PATENT DOCUMENTS

| | | |
|---|---|---|
| 6,125,466 A | 9/2000 | Close et al. |
| 6,161,209 A | 12/2000 | Moher |
| 6,397,366 B1 * | 5/2002 | Tanaka et al. .............. 714/769 |
| 6,434,719 B1 | 8/2002 | Livingston |
| 6,453,439 B1 | 9/2002 | Hattori et al. |
| 6,460,162 B1 | 10/2002 | Buda et al. |
| 6,499,128 B1 | 12/2002 | Gerlach et al. |
| 6,526,538 B1 | 2/2003 | Hewitt |
| 6,574,775 B1 | 6/2003 | Chouly |
| 6,581,178 B1 | 6/2003 | Kondo |
| 6,799,287 B1 * | 9/2004 | Sharma et al. .............. 714/703 |

* cited by examiner

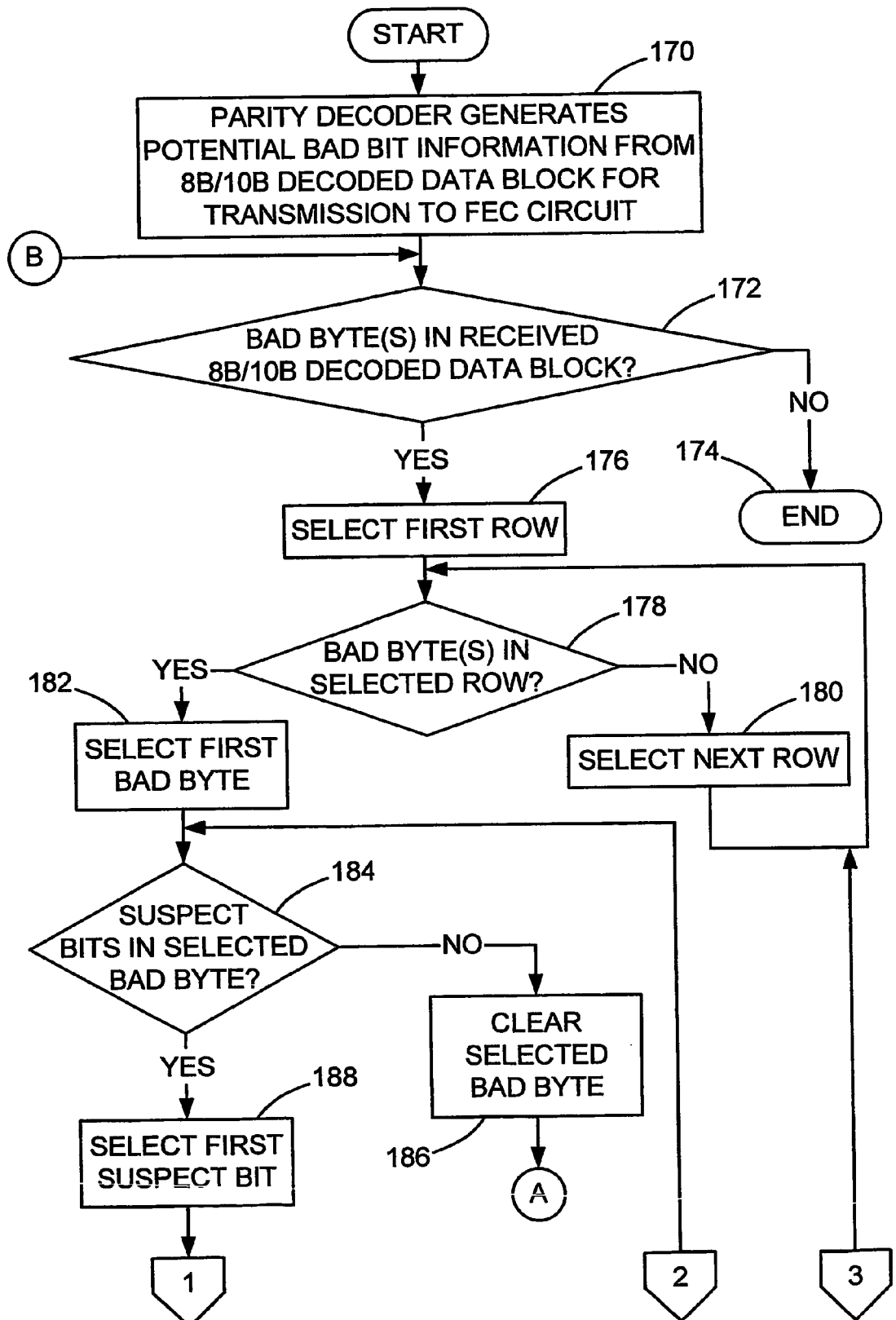
FIG. 6-A

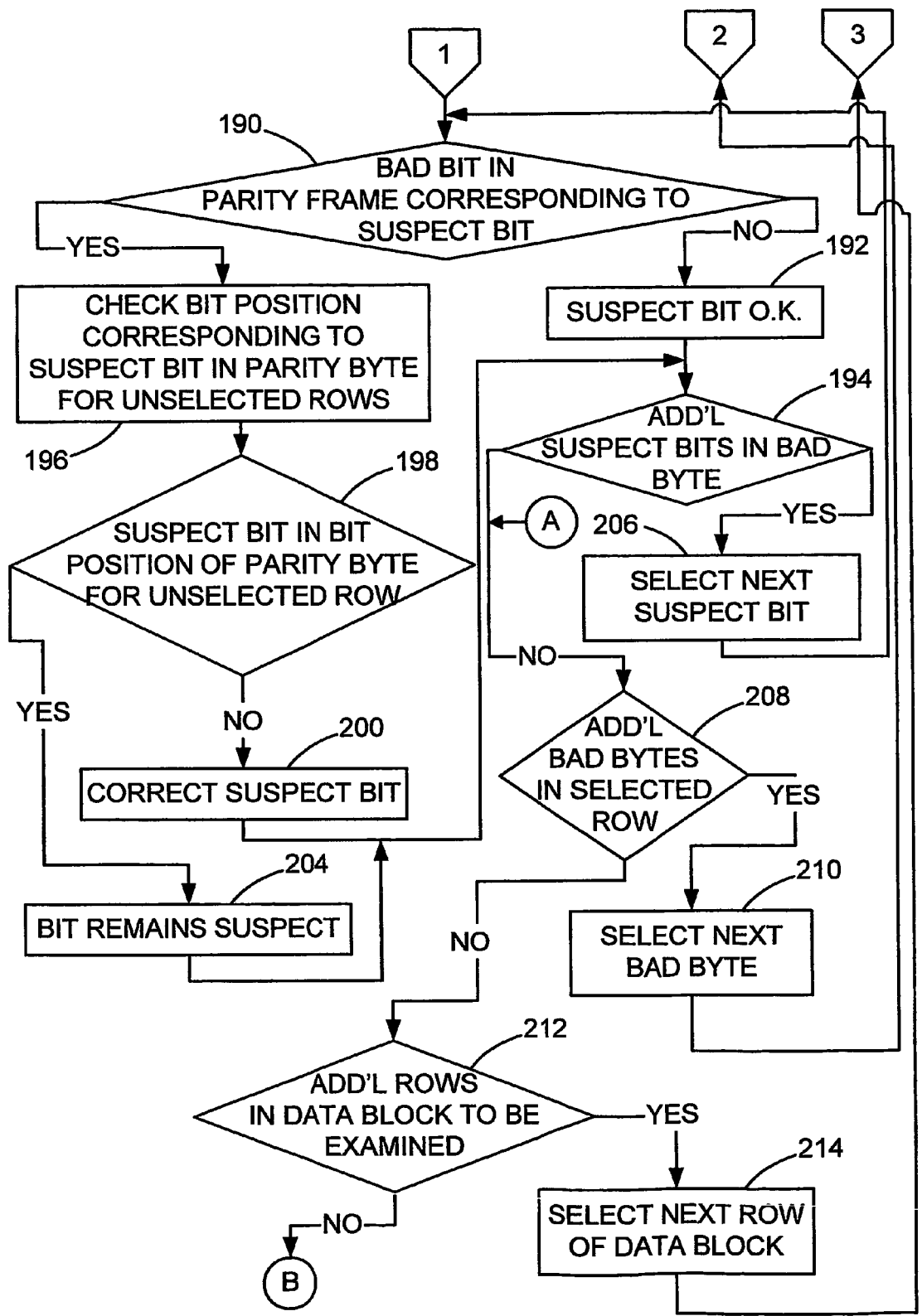
FIG. 6-B

METHOD OF FORWARD ERROR CORRECTION

CROSS REFERENCE

This application claims the benefit, under 35 U.S.C. § 365 of International Application PCT/US03/19154, filed Jun. 17, 2003, which was published in accordance with PCT Article 21(2) on Dec. 31, 2003 in English and which claims the benefit of United States provisional patent application No. 60/390,842, filed Jun. 21, 2002.

FIELD OF THE INVENTION

The present invention relates to error correction techniques and, more particularly, to a method of forward error correction of digital signals suitable for use in broadcast routers.

BACKGROUND OF THE INVENTION

A broadcast router allows each one of a plurality of outputs therefrom to be assigned the signal from any one of a plurality of inputs thereto. For example, an N×M broadcast router has N inputs and M outputs coupled together by a routing engine which allows any one of the N inputs to be applied to each one of the M outputs. Oftentimes, it is desirable to construct a larger broadcast router, for example a 4N×4M broadcast router, from plural smaller broadcast routers, for example, the aforementioned N×M broadcast router. To interconnect smaller broadcast routers requires the use of plural links, for example, copper wire, to transport signals between the smaller broadcast routers. The use of such links can, however, act as a limit on the speed at which the broadcast router can operate.

Clock data recovery (or "CDR") serial data links are often used when high speed data transfers between devices, for example, the aforementioned broadcast routers, are desired. Heretofore, CDR serial data links have been used in applications which allow the retransmission of data with errors. However, when using a broadcast router, there is insufficient time to allow for retransmissions of data As a result, in order to use a CDR or other high speed serial data link, a broadcast router must be equipped for forward error correction (or "FEC") of the received data. The use of current FEC techniques, for example, Viterbi or Reed-Solomon FEC techniques, however, would add considerable overhead to the data transmissions. 8-bit/10-bit (or "8B/10B") encoders and decoders are often used to improve reliability in data transmissions. An 8B/10B encoder encodes 8-bit bytes of binary data into 10-bit bytes plus a disparity bit which indicates whether there is a difference in the number of ones and the number of zeros in the 10-bit byte. Conversely, an 8B/10B decoder converts 10-bit bytes of binary data into 8-bit bytes plus a disparity bit. While 8B/10B encoders and decoders can be used to identify data errors, generally, they are only capable of identifying data errors on a byte-wide basis and cannot identify a particular data bit, within a "bad" data byte, which is erroneous.

SUMMARY OF THE INVENTION

The present invention is directed to an iterative method of correcting errors in a data block. In accordance with the method, at least one suspect bit indicative of a possible error is identified. Each suspect bit is subsequently classified as either a confirmed error bit or as an unconfirmed error bit. Each suspect bit classified as a confirmed error bit is correct and the method repeated until all suspect bits confirmable as an error bit have been corrected. Preferably, the iterative method of error correction is accomplished using a combination of information derived from 8B/10B encoding/decoding of the data block, information derived from parity encoding along each row of the data block and information derived from parity encoding along each column of the data block.

BRIEF DESCRIPTION OF THE DRAWINGS

FIG. 6 is a flow chart of a method of forward error correction of the data block of FIG. 5.

DETAILED DESCRIPTION

Figure 1:
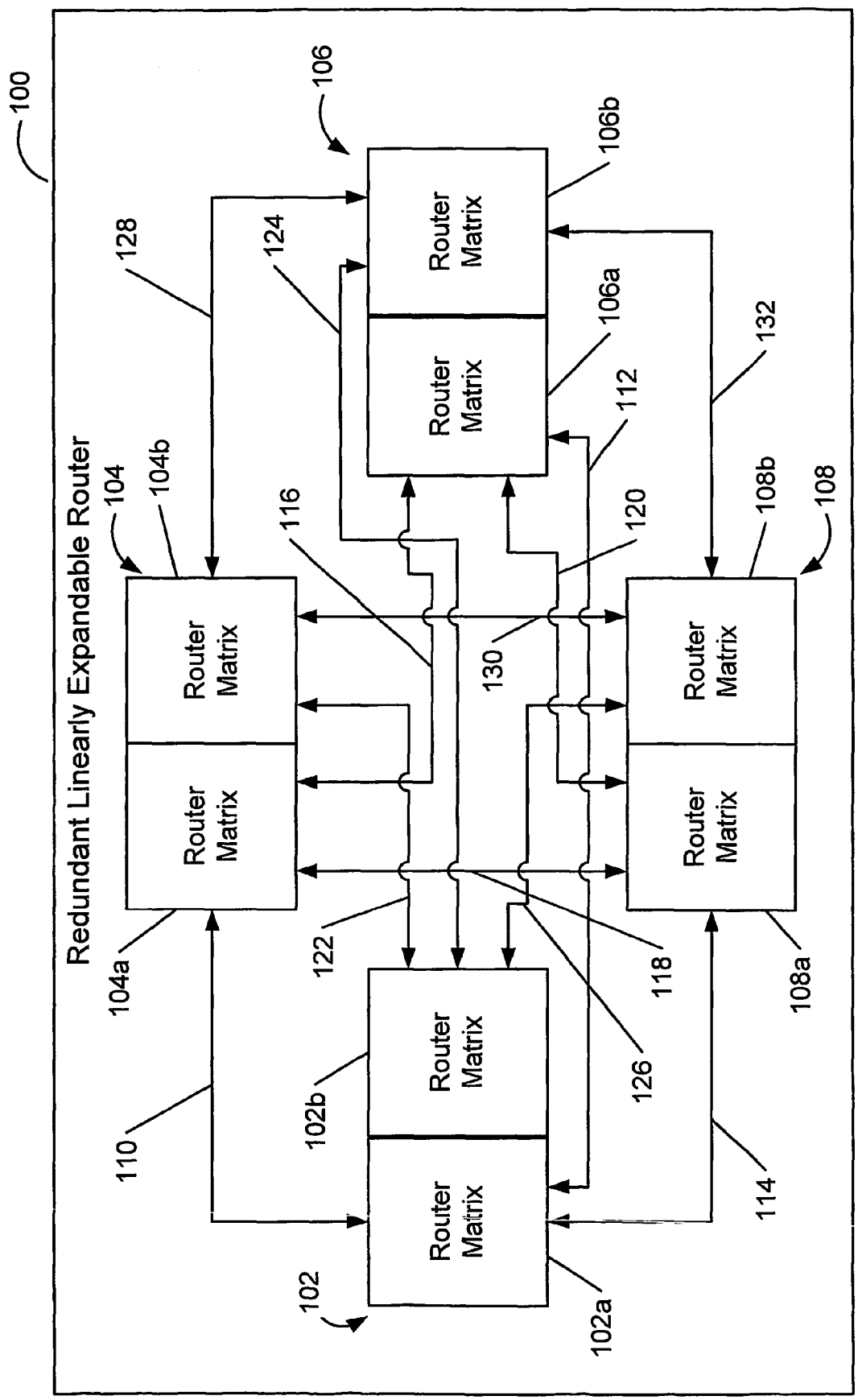
FIG. 1 is a block diagram of a fully redundant linearly expandable broadcast router constructed in accordance with the teachings of the present invention.

Referring first to FIG. 1, a fully redundant linearly expandable broadcast router 100 constructed in accordance with the teachings of the present invention will now be described in greater detail. As may now be seen, the fully redundant linearly expandable broadcast router 100 is comprised of plural broadcast router components coupled to one another to form the larger fully redundant linearly expandable broadcast router 100. Each broadcast router component is a discrete router device which includes first and second router matrices, the second router matrix being redundant of the first router matrix. Thus, each broadcast router has first and second routing engines, one for each of the first and second router matrices, each receiving, at an input side thereof, the same input digital audio streams and placing, at an output side thereof, the same output digital audio streams. As disclosed herein, each of the broadcast router components used to construct the fully redundant linearly expandable broadcast router are N×M sized broadcast routers. However, it is fully contemplated that the fully redundant linearly expandable broadcast router 100 could instead be constructed of broadcast router components of different sizes relative to one another.

As further disclosed herein, the fully redundant linearly expandable broadcast router 100 is formed by coupling together first, second, third and fourth broadcast router components 102, 104, 106 and 108. Of course, the present disclosure of the fully redundant linearly expandable broadcast router 100 as being formed of four broadcast router components is purely by way of example. Accordingly, it should be clearly understood that a fully redundant linearly expandable broadcast router constructed in accordance with the teachings of the present invention may be formed using various other numbers of broadcast router components. The first, second, third and fourth broadcast router components 102, 104, 106 and 108 which, when fully connected in the manner disclosed herein, collectively form the fully redundant linearly expandable broadcast router 100, may either be housed together in a common chassis as illustrated in FIG. 1 or, if desired, housed in separate chassis. While, as previously set forth, the broadcast router components 102, 104, 106 and 108 may have different sizes relative to one another or, in the alternative, may all have the same N×M size, one size that has proven suitable for the uses contemplated herein is 256×256. Furthermore, a suitable configuration for the fully redundant linear expandable broadcast router 100 would be to couple five broadcast router components, each sized at 256×256, thereby resulting in a 1,280×1,280 broadcast router.

The first broadcast router component 102 is comprised of a first router matrix 102a and a second (or redundant) router matrix 102b used to replace the first router matrix 102a in the event of a failure thereof. Similarly, each one of the second, third and fourth broadcast router components 104, 106, and 108 of the fully redundant linearly expandable broadcast router 100 are comprised of a first router matrix 104a, 106a and 108a, respectively, and a second (or redundant) router matrix 104b, 106b and 108b, respectively, used to replace the first router matrix 104a, 106a and 108a, respectively, in the event of a failure thereof. Of course, the designation of the second router matrices 102b, 104b, 106b and 108b as backups for the first router matrices 102a, 104a, 106a and 108a, respectively, is purely arbitrary and it is fully contemplated that either one of a router matrix pair residing within a broadcast router component may act as a backup for the other of the router matrix pair residing within that broadcast router component.

As may be further seen in FIG. 1, the first router matrix 102a of the first broadcast router component 102, the first router matrix 104a of the second broadcast router component 104, the first router matrix 106a of the third broadcast router component 106 and the first router matrix 108a of the fourth broadcast router component 108 are coupled together in a first arrangement of router matrices which conforms to a fully connected topology. Similarly, the second router matrix 102b of the first broadcast router component 102, the second router matrix 104b of the second broadcast router component 104, the second router matrix 106b of the third broadcast router component 106 and the second router matrix 108b of the fourth broadcast router component 108 are coupled together in a second arrangement which, like the first arrangement, conforms to a fully connected topology. In a fully connected topology, each router matrix of an arrangement of router matrices is coupled, by a discrete link, to each and every other router matrix forming part of the arrangement of router matrices.

Thus, for the first arrangement of router matrices, first, second and third bi-directional links 110, 112 and 114 couples the first router matrix 102a of the first broadcast router component 102 to the first router matrix 104a of the second broadcast router component 104, the first router matrix 106a of the third broadcast router component 106 and the first router matrix 108a of the fourth broadcast router component 108, respectively. Additionally, fourth and fifth bi-directional links 116 and 118 couple the first router matrix 104a of the second broadcast router component 104 to the first router matrix 106a of the third broadcast router component 106 and the first router matrix 108a of the fourth broadcast router component 108, respectively. Finally, a sixth bi-directional link 120 couples the first router matrix 106a of the third broadcast router component 106 to the first router matrix 108a of the fourth broadcast router component 108.

Similarly, for the second arrangement of router matrices, first, second and third bi-directional links 122, 124 and 126 couples the second router matrix 102b of the first broadcast router component 102 to the second router matrix 104b of the second broadcast router component 104, the second router matrix 106b of the third broadcast router component 106 and the second router matrix 108b of the fourth broadcast router component 108, respectively. Additionally, fourth and fifth bi-directional links 128 and 130 couple the second router matrix 104b of the second broadcast router component 104 to the second router matrix 106b of the third broadcast router component 106 and the second router matrix 108b of the fourth broadcast router component 108, respectively. Finally, a sixth bi-directional link 132 couples the second router matrix 106b of the third broadcast router component 106 to the second router matrix 108b of the fourth broadcast router component 108.

Figure 2:
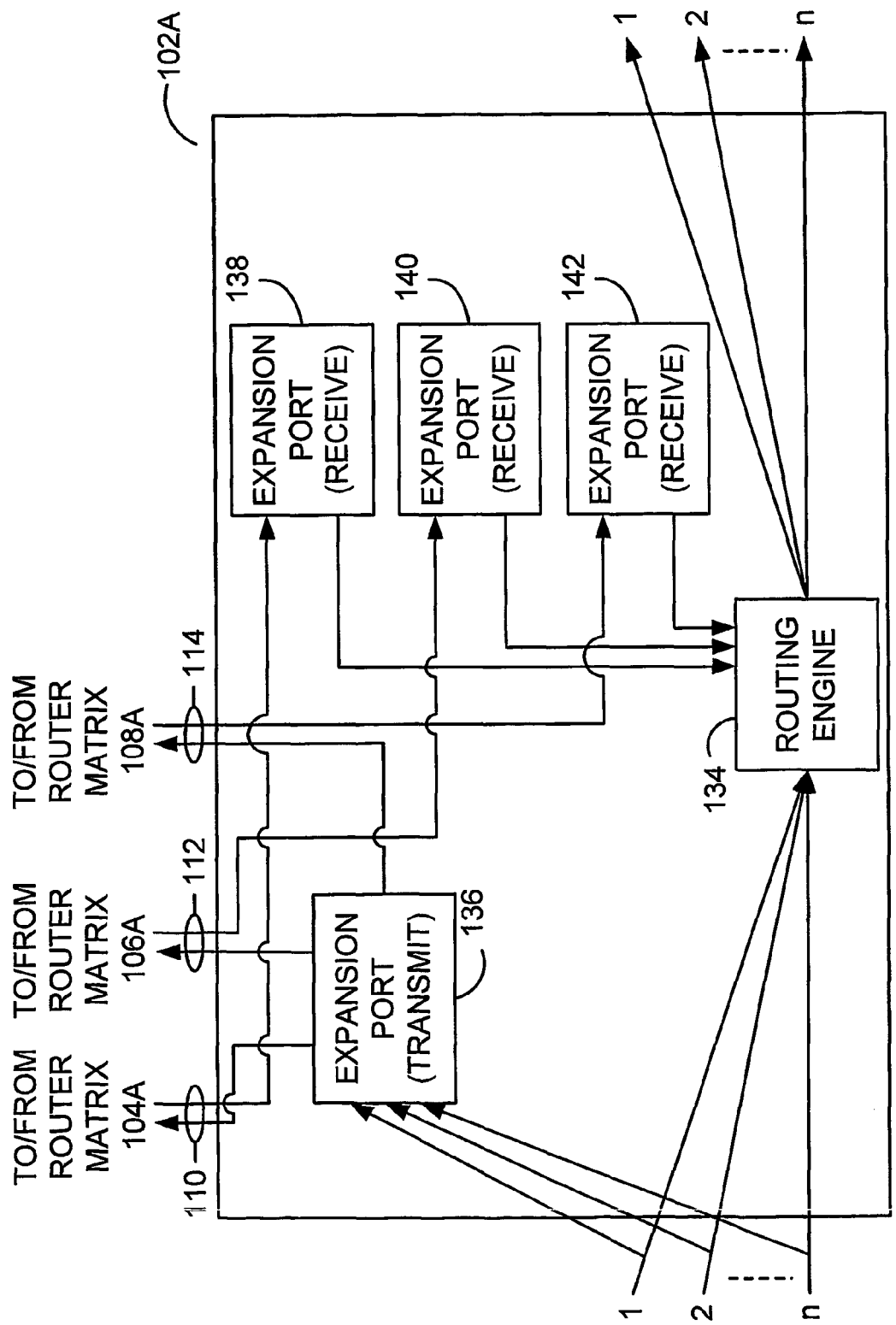
FIG. 2 is an expanded block diagram of a first router matrix of a first broadcast router component of the fully redundant linearly expandable broadcast router of FIG. 1.

Referring next to FIG. 2, the first router matrix 102a of the first broadcast router component 102 will now be described in greater detail. As may now be seen, the first router matrix 102a of the first broadcast router component 102 is comprised of a routing engine 134, a transmit expansion port 136, a first receive expansion port 138, a second receive expansion port 140 and a third receive expansion port 142. By the term "transmit" expansion port, it is intended to refer to an expansion port from which data is transmitted to a selected destination. Similarly, by the term "receive" expansion port, it is intended to refer to an expansion port which receives data from a destination. Residing within the routing engine 134 is switching means (not shown) for assigning any one of plural input digital audio data signals received as inputs to the routing engine 134 to any one of plural output lines of the routing engine 134. Variously, it is contemplated that the routing engine 134 may be embodied in software, for example, as a series of instructions; hardware, for example, as a series of logic circuits; or a combination thereof. In a broad sense, the transmit expansion port 136 of the first router matrix 102a of the first broadcast router component 102 is comprised of a memory subsystem (not shown) in which plural input digital audio data streams may be buffered before transfer to their final destinations and a processor subsystem (also not shown) for controlling the transfer of the plural input digital audio data streams received by the transmit expansion port 136 to a receive expansion port of the first router matrix of another broadcast router component. Conversely, each one of the first, second and third receive expansion ports 138, 140 and 142 of the first router matrix 102a are, in a broad sense, comprised of a memory subsystem (not shown) in which plural input digital audio data streams received from a transmit expansion port of a first router matrix of another broadcast router component may be buffered before transfer to their final destination and a processor subsystem (also not shown) for controlling the transfer of the input digital audio data streams received from the receive expansion port of the first router matrix of the other broadcast router component to inputs of the routing engine 134.

N input digital audio data streams, each of which conforms to either the Audio Engineering Society-3 (or "AES-3") standard or multichannel digital audio interface (or "MADI") standard wet forth in the AES-10 standard are received by the routing engine 134 and the transmit expansion port 136 of the first router matrix 102a of the first broadcast router component 102. In this regard, it should be noted that a MADI input digital audio data stream may contains up to 32 AES-3 digital audio data streams and that, if the N input digital audio data streams input the routing engine 134 and the transmit expansion port 136 conform to the MADI standard, each input digital audio data stream would be a single AES-3 digital audio stream which has been previously extracted from a MADI input digital audio data stream by extraction circuitry (not shown). Of course, it should be readily appreciated that other types of input data streams other than the input digital audio streams disclosed herein are equally suitable for use with the first router matrix 102a of the first broadcast router component 102. For example, it is contemplated that the first router matrix 102a of the first broadcast router component 102 may instead be used with other low bandwidth digital signals such as compressed video and data signals. It is further contemplated that, with minor modifications, for example, faster hardware, the first router matrix 102a of the first broadcast router component 102 may be used with non-compressed digital video signals.

Figure 3:
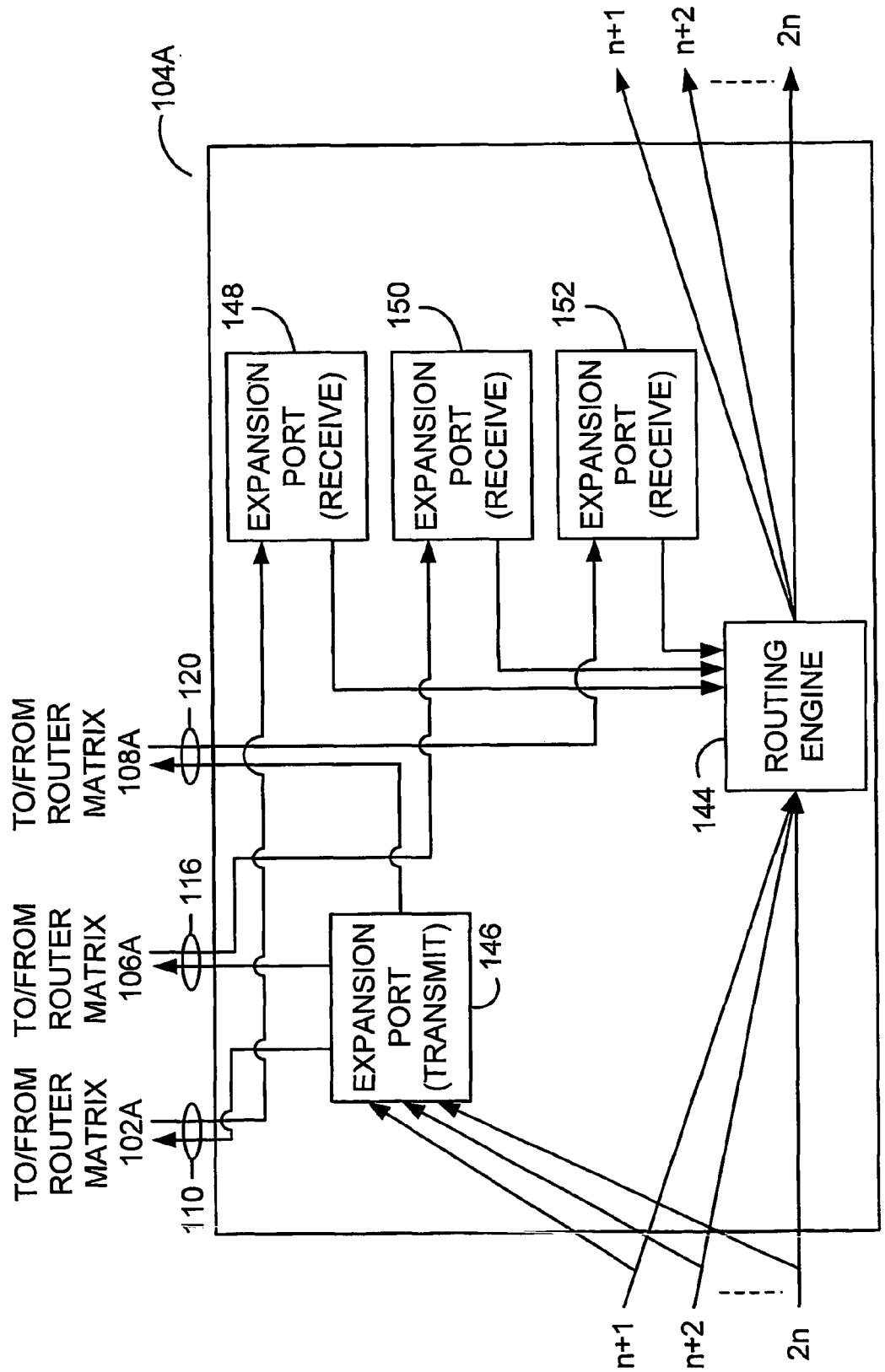
FIG. 3 an expanded block diagram of a first router matrix of a second broadcast router component of the fully redundant linearly expandable broadcast router of FIG. 1.

Referring next to FIG. 3, the first router matrix 104a of the second broadcast router component 104 will now be described in greater detail. As may now be seen, the first router matrix 104a of the second broadcast router component 104 is comprised of a routing engine 144, a transmit expansion port 146, a first receive expansion port 148, a second receive expansion port 150 and a third receive expansion port 152. Residing within the routing engine 144 is switching means (not shown) for assigning any one of plural input digital audio data signals received as inputs to the routing engine 144 to any one of plural output lines of the routing engine 144. Variously, it is contemplated that the routing engine 144 may be embodied in software, for example, as a series of instructions; hardware, for example, as a series of logic circuits; or a combination thereof. In a broad sense, the transmit expansion port 146 of the first router matrix 102a is comprised of a memory subsystem (not shown) in which plural input digital audio data streams may be buffered before transfer to their final destinations and a processor subsystem (also not shown) for controlling the transfer of the plural input digital audio data streams received by the transmit expansion port 146 to a receive expansion port of the first router matrix of another broadcast router component. Conversely, each one of the first, second and third receive expansion ports 148, 150 and 152 of the first router matrix 104a of the second broadcast router component 104 are, in a broad sense, comprised of a memory subsystem (not shown) in which plural input digital audio data streams received from an expansion port of a first router matrix of another broadcast router component may be buffered before transfer to their final destination and a processor subsystem (also not shown) for controlling the transfer of the input digital audio data streams received from the receive expansion port of the first router matrix of the other broadcast router component to inputs of the routing engine 144.

Input digital audio data streams 1 through N are fed into the routing engine 134 and the transmit expansion port 136 of the first router matrix 102a of the first broadcast router component 102. From the transmit expansion port 136, input digital audio data streams 1 through N are forwarded to the first receive expansion port 148 of the first router matrix 104a of the second broadcast router component 104, a receive expansion port (not shown) of the first router matrix 106a of the third broadcast router component 106 and a receive expansion port (also not shown) of the fourth router matrix 108a of the fourth broadcast router component 108. In turn, input digital audio data streams N+1 through 2N, 2N+1 through 3N and 3N+1 through 4N are transmitted, by the transmit expansion port of the first router matrix of the second, third and fourth broadcast router components 104, 106 and 108, respectively, to the first, second and third expansion ports 138, 140 and 142, respectively, of the first router matrix 102a of the first broadcast router component 102.

Similarly, input digital audio data streams N+1 through 2N are fed into the routing engine 144 and the transmit expansion port 146 of the first router matrix 104a of the second broadcast router component 104. From the transmit expansion port 146, input digital audio data streams N+1 through 2N are forwarded to the first receive expansion port of the first router matrix 102a of the first broadcast router component 102, a receive expansion port (not shown) of the first router matrix 106a of the third broadcast router component 106 and a receive expansion port (also not shown) of the fourth router matrix 108a of the fourth broadcast router component 108. In turn, input digital audio data streams 1 through N, 2N+1 through 3N and 3N+1 through 4N are transmitted, by the transmit expansion port 136 of the first router matrix 102a of the first broadcast router component, a transmit expansion port (not shown) of the first router matrix 106a of the third broadcast router component 106 and a transmit expansion port (also not shown) of the first router matrix 108a of the fourth broadcast router component 108, respectively, to the first, second and third expansion ports 148, 150 and 152, respectively, of the first router matrix 104a of the second broadcast router component 104.

Figure 4:
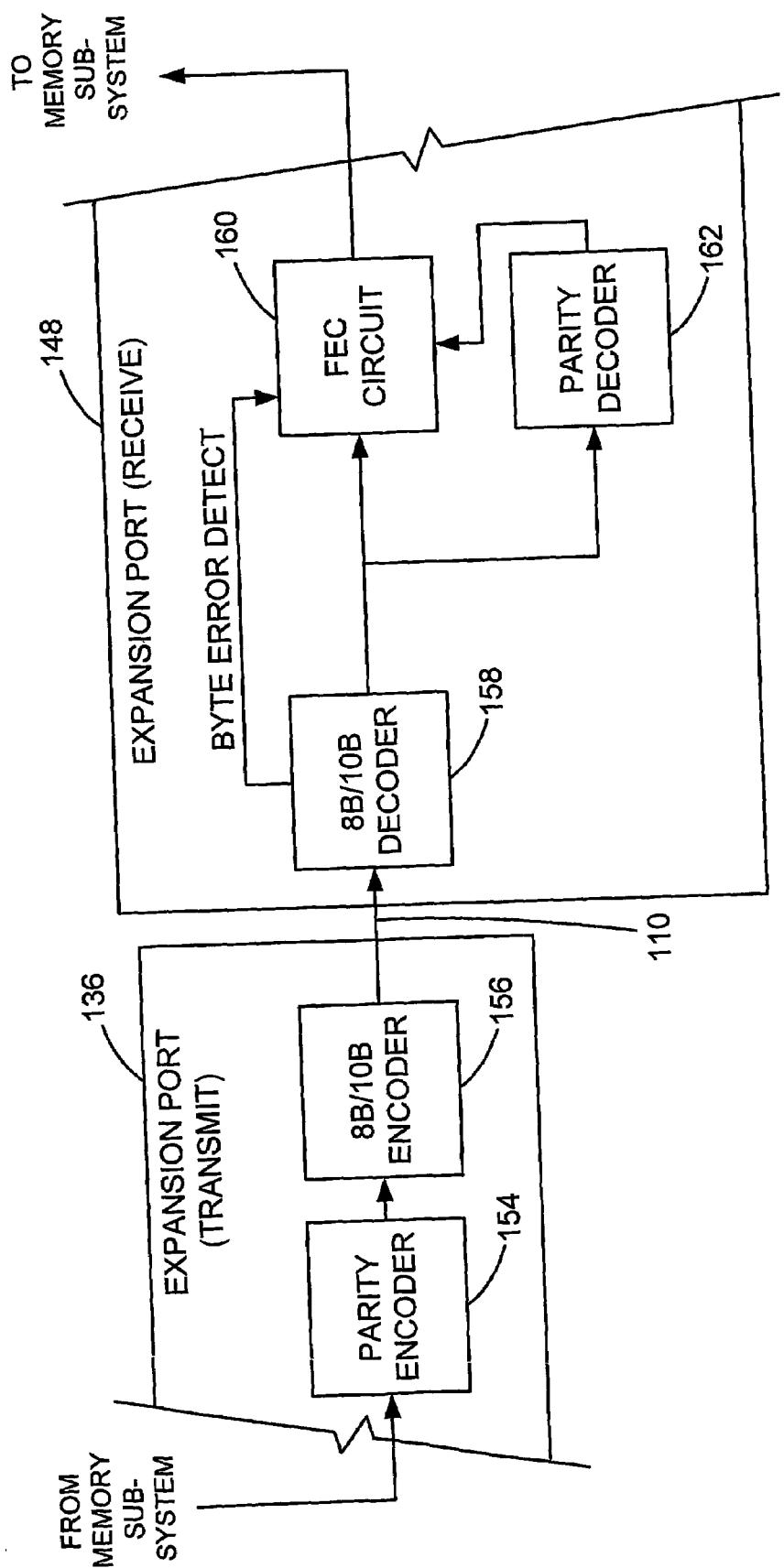
FIG. 4 an expanded block diagram of a transmit expansion port of the router matrix of FIG. 2 and a receive expansion port of the router matrix of FIG. 3

Referring next to FIG. 4, the transfer of input digital audio data streams 1 through N from the transmit expansion port 136 of the first router matrix 102a of the first broadcast router component 102 to the receive expansion port 148 of the first router matrix 104a of the second broadcast router component 104 along the link 110 will now be described in greater detail. While, as disclosed herein, 8B/10B encoding/decoding is applied to the input digital audio data streams 1 through N, it should be clearly understood that other encoding/decoding schemes may be used instead. For example, it is fully contemplated that a 4-bit/5-bit (or "4B/5B") encoder and decoder may be used in place of the 8B/10B encoder and decoder disclosed herein. Finally, in addition to 4B/5B encoding/decoding, it is further contemplated that encoders and decoders which employ other encoding/decoding schemes similar to 8B/10B encoding/decoding would be suitable as well.

As will be more fully described below, upon initiation of the transfer of the input audio data streams 1 through N from the transmit expansion port 136 to the first receive port 148, the data streams are forwarded from the memory subsystem forming part of the transmit expansion port 136 to a parity encoder 154 also forming part of the transmit expansion port 136. At the parity encoder 154, the input audio data streams 1 through N undergo parity encoding along both the horizontal and vertical axes. From the parity encoder 154, the parity encoded data streams 1 through N are then forwarded to an 8B/10B encoder 156 for 8B/10B encoding. From the 8B/10B encoder 156, the 8B/10B parity encoded data streams are then transferred to the first receive expansion port 148 over the link 110. Upon receipt by the first receive expansion port 148, the 8B/10B parity encoded data streams 1 through N are forwarded to an 8B/10B decoder 158. From the received 8B/10B parity encoded data streams, the 8B/10B decoder 158 generates parity encoded data streams 1 through N and byte error detect information which indicates which data bytes of the parity encoded data streams 1 through N are "bad" data bytes containing one or more erroneous bits of data.

From the 8B/10B decoder 158, the parity encoded data streams 1 through N are forwarded to both an FEC circuit 160 and a parity decoder 162. Additionally, the 8B/10B decoder 158 forwards byte error detect information to the FEC circuit 160. By decoding the received parity encoded data streams 1 through N, the parity decoder 162 generates bit error information for subsequent forwarding to the FEC circuit 160. Using the byte error detect information received from the 8B/10B decoder 158 in combination with the bit error information received from the parity decoder 162, the FEC circuit 160 executes an iterative algorithm described below with respect to FIG. 6 to correct those errors contained in the parity encoded data streams. Once the errors in the parity encoded data streams are corrected by the FEC circuit 160, the error corrected, parity encoded data streams 1 through N are forwarded to the memory subsystem of the first receive expansion port 148 for further handling in the manner previously described. Of course, since the data streams 1 through N have already been corrected for parity errors, parity information contained in the data streams 1 through N may either be dropped by the FEC circuit 160 prior to transmission of the data streams 1 through N to the memory subsystem of the first receive expansion port 148 or carried forward with the data streams 1 through N to the memory subsystem of the first receive expansion port 148 but subsequently ignored thereat.

Figure 5:
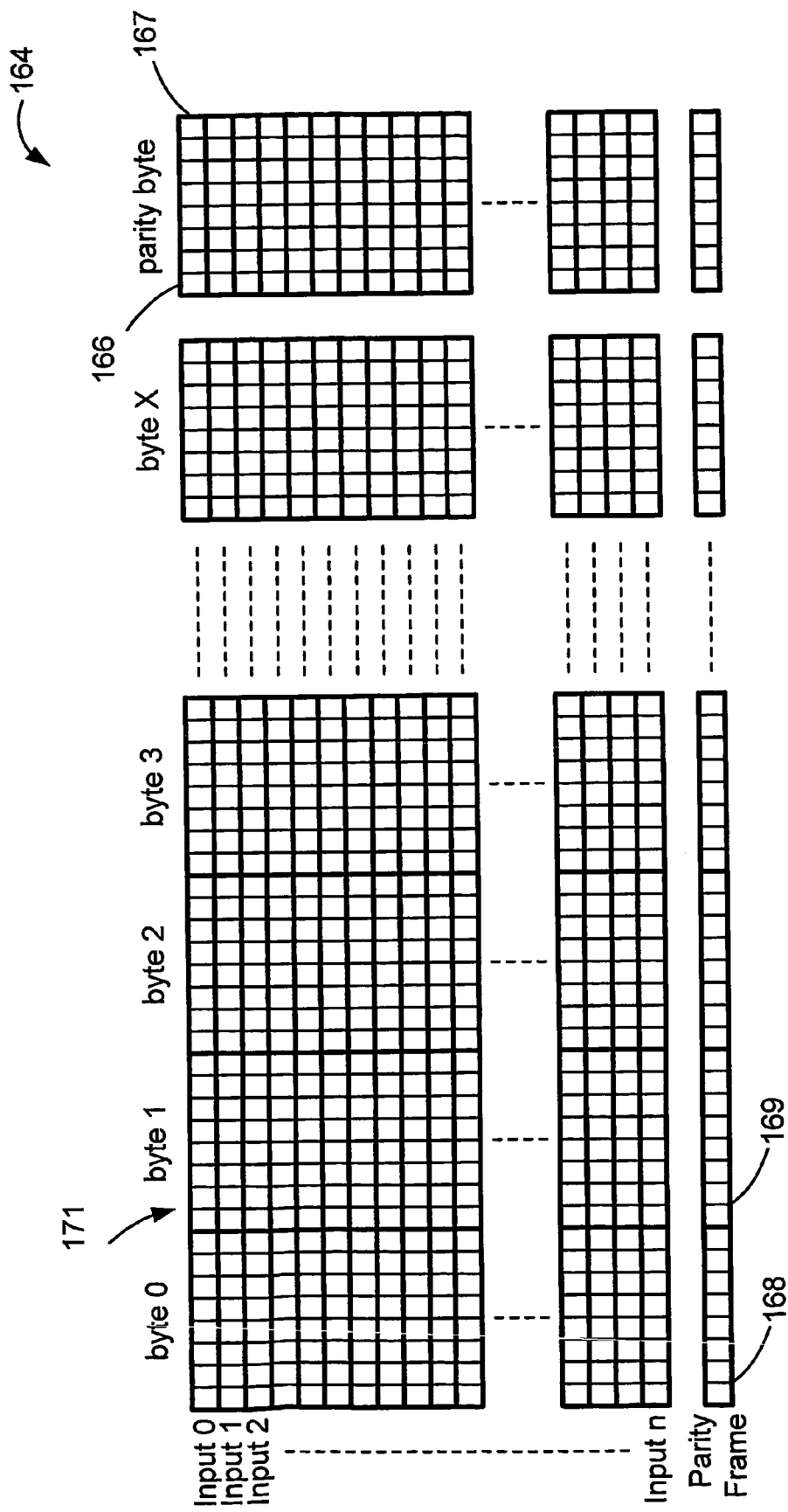
FIG. 5 is a block diagram of a data block transferred between the transmit and receive expansion ports of FIG. 4.

Referring next to FIG. 5, a block 164 of parity encoded data produced by the parity encoder 154 will now be described in greater detail. As may now be seen, each data block 164 is comprised of X bytes of the input digital audio data streams 1 through N. Each input digital audio data stream forms a row of the data block 164 while each bit of each byte forms a column of the data block 164. For each input 1 through N, the parity encoder 154 constructs a parity byte comprised of parity bits 0 through 7. For example, parity byte 166 is constructed for input digital audio data stream 0. Bit 0 of the parity byte 166 is calculated by summing all of the bit 0's for bytes 1 through X of input digital audio data stream 0. In other words, bit 0 of the parity byte 166 is calculated by summing all of the bit 0's in row 167 of the data block 164. Bits 1 through 7 of the parity byte 166 ate similarly calculated. The data block further includes a parity frame 168 having X+1 bytes. Each bit of the parity frame 168 is calculated, by the parity encoder 154, by summing the same bit for each one of the 1 through N input data streams. In other words, a bit of the parity frame 168 is calculated by summing all of the bits in a column of the data block 164. For example, bit 169 of the parity frame 168 is calculated by summing all of the bits in row 171 of the data block 164. While a parity frame may be calculated for any number of rows, calculating a parity frame for every 32 input data streams has been suitable for the uses contemplated herein.

Referring next to FIG. 6, a method of forward error correction of a data block, for example, the data block 164 of FIG. 5, by the FEC circuit 160 will now be described in greater detail. It should be clearly understood, however, that while the disclosed technique is described with respect to a data block transmitted between components of a broadcast router, it is fully contemplated that the technique is equally applicable for use with data blocks transmitted between other types of devices. The method commences at step 170 with the parity decoder 162 receiving the data block 164 from the 8B/10decoder 158 and the FEC circuit 160 receiving both the data block 164 and byte-error detect information from the 8 B/10 B decoder 158. At step 171, the parity decoder 162 decodes the received data block 164 to generate potential bad bit information for the received data block 164 and forwards the generated potential bad bit information to the FEC circuit 160. To generate a first component of the potential bad bit information for the received data block, the parity decoder performs a bit-by-bit check of the parity byte for each row of the data block 164. To do so, the parity decoder 162 selects a row of the data block 164, sums bit 0 for bytes 1 through X of the selected row and then compares the calculated sum to bit 0 of the parity byte for the selected row. If the two fail to match, the parity decoder 162 identifies bit 0 of each byte of the selected row as a suspect bit. The parity decoder 162 would then perform similar determinations for bits 0 through 7 of the selected row. By doing so, all suspect bits for each data byte of the selected row are identified. The process would then be repeated for each row of the data block 164. For example, if row 167 and bit 0 were selected for checking, the parity decoder 162 would sum bit 0 for bytes 0 through X for comparison to bit 0 of the parity byte 166 for the row 167. If the determined sum of bit 0 of bytes 0 through X of the row 167 does not agree with the value of bit 0 of the byte 166, the parity decoder 162 would determine that bit 0 of each one of bytes 0 through X of row 167 is a potential bad bit.

To generate a second component of the potential bad bit information for the received data block 164, the parity decoder 162 performs a bit-by-bit check on the parity frame. To do so, the parity decoder selects a column of the data block 164, sums the data bit contained in the selected column for inputs 1 through N and then compares the calculated sum to the bit of the parity frame contained in the selected column. If the two fail to match, the parity decoder 162 determines that the selected column contains a bad bit and identifies, for each one of inputs 1 through N, the bit contained in the selected column as a suspect bit. The process would then be repeated for each column of the data block 164. For example, if the column corresponding to bit 3 of byte 1 were selected, the parity decoder 162 would sum bit 3 of byte 1 for inputs 1 through N for comparison to bit 3 of byte 1 of the parity frame 168. If the determined sum of bit 3 of byte 1 for inputs 1 through N does not agree with the value of bit 3 of byte 1 of the parity frame 168, then the parity decoder 162 would determine that bit 3 of byte 1 of each input 1 through N is a potentially bad bit.

Proceeding on to step 172, the FEC circuit 160 checks the received byte error detect information to see if the received data block 164 contains one or more bad bytes. A bad byte is identified whenever a check of the received byte error detect information produces a decoding error (the received code is not a legal value) or an anomaly (the received code is a legal value but has a disparity problem). As previously discussed, 8B/10B decoding is capable of identifying whether any particular byte of data is bad but cannot identify which bits of the data byte is causing it to be bad. For example, the byte error detect information may indicate that byte 1 of input 0 and byte 3 of input 2 are bad. If it is determined at step 172 that the byte error detect information indicates that the data block 164 does not contain any bad bytes, the method ends at step 174. If, however, it is determined at step 172 that the data block 164 contains one or more bad bytes, the method proceeds to step 176.

A first row of the data block 164, for example, the row 167 corresponding to input 0, is selected at step 176 and, at step 178, the FEC circuit 160 determines, from the byte error detect information, if there is one or more bad byte in the selected row. If there are no bad bytes in the selected, row, the method proceeds to step 180 where a next row, for example, the row corresponding to input 1 is selected and then returns to step 178 for further processing in the manner described herein. If, however, the FEC circuit 160 determines, at step 178, that the selected row contains one or more bad bytes, the method will instead proceed to step 182 where a first bad byte of the selected row, for example, byte 1 of row 0 is selected for further processing. At step 184 the FEC circuit 160 checks the selected bad for the selected row to determine if there are any suspect bits for the selected bad byte. To do so, the FEC circuit 160 checks the first component of the potential bad bit information supplied by the parity decoder 162 to see if a suspect bit was identified for the selected bad byte.

If a review of the first component of the potential bad bit information supplied by the parity decoder indicates that none of the bits of the selected bad byte are suspect, the FEC circuit 160 determines that the selected bad byte is no longer bad. Accordingly, the method will proceed to step 186 where the selected bad byte is "cleared", typically, by removing the bad byte from the list of bad bytes contained in the byte error detect information received, by the FEC circuit 160, from the 8B/10B decoder 158. After clearing the selected bad byte at step 186, the method will proceed to step 208, below, for further processing. If, however, a review of the first component of the potential bad bit information supplied by the parity decoder indicates that one or more of the bits of the selected bad byte are suspect, the method will instead proceed to step 188 for selection of a first suspect bit of the selected bad byte.

Continuing on to step 190, the FEC circuit 160 then reviews the second component of the potential bad bit information to determine if there is the suspect bit is located in a column of the data block 164 previously determined as containing a bad bit. For example, if bit 3 of byte 1 for input 0 is the selected suspect bit, at step 190, the FEC circuit 160 would check the second component of the potential bad bit information to see if the suspect bit is located in a column previously determined to contain a bad bit. If the FEC circuit 160 determines that the suspect bit is not located in a column previously determined to contain a bad bit, the method would first proceed to step 192 where the FEC circuit 160 would conclude that the suspect bit is correct and then on to step 194 where it is determined if there are additional suspect bits in the selected bad byte requiring examination.

If, however, it is determined at step 190 that the suspect bit is located in a column identified, by the second component of the potential bad bit information, as containing a bad bit, the method will instead proceed to step 196 where the first component of the potential bad bit information is reviewed to determine if any of the unselected rows the unselected rows where the bit position of the parity byte which corresponds to the suspect bit is checked for the unselected rows. For example, if bit 3 of byte 1 for input 0 is the selected suspect bit and it is determined from the review of the second component of potential bad bit information that there is an error in bit 3 of byte 1 for one of the input 1 through N, the FEC circuit 160 will review the contents of the first component of the potential bad bit information to see if bit 3 of byte 1 for any of inputs 1 through N where identified as suspect. Proceeding on to step 198, if a review of the first component of the potential bad bit information reveals that that none of the bits in the unselected rows which correspond to the suspect bit are themselves suspect, then the FEC circuit 160 concludes that the suspect bit is erroneous. The method will then proceed to step 200 where the FEC circuit 160 corrects the suspect bit.

If, however, it is determined at step 198 that the bit in one or more of the unselected rows which corresponds to the suspect bit is suspect itself, the method will instead proceed to step 204 where the FEC circuit 160 concludes that the selected suspect bit remains suspect and cannot be corrected at this time. Upon either: (1) concluding, at step 192, that the suspect bit is correct; (2) correcting the selected suspect bit at step 200; or (3) concluding, at step 204, that the selected suspect bit must remain suspect, the method proceeds to step 194 where the FEC circuit 160 determines if there are additional suspect bits in the selected bad byte. If it is determined at step 194 that there are additional suspect bits in the selected bad byte, the method will proceed to step 206 for selection of a next suspect bit of the selected bad byte. The method will then return to step 190 for processing of the newly selected suspect bit in the manner previously described.

If, however, it is determined at step 194 that there are no additional suspect bits in the selected bad byte, the method will instead proceed to step 208 where the FEC circuit 160 determines if there are additional bad bytes in the selected row, again by checking the list of bad bytes provided as part of the byte error detect information received from the 8B/10B decoder 158. If the check of the list of bad bytes indicates that there are one or more additional bad bytes in the selected row, the method will proceed to step 210 for selection of a next bad byte in the selected row. The method will then return to step 184 for further processing of the newly selected bad byte in the manner previously described. If, however, it is determined at step 208 that there are no additional bad bytes in the selected row, the method will instead proceed to step 212 where it is determined if there are additional rows in the data block 164 to be examined. If it is determined at step 212 that there are additional rows in the data block 164 to be examined, the 25 method will proceed to step 214 for selection of a next row of the data block 164. The method will then return to step 178 for further processing in the manner previously described. If, however, it is determined at step 212 that there are no additional rows to be examined, in other words, each one of the rows 1 through N have been examined, the method will return to step 172 for further processing in the manner previously described.

The foregoing process is an iterative method of correcting errors contained in a data block such as the data block 176. In each pass through steps 170 through 214, plural suspect bits are typically identified for the data block 176. However, not all of the suspect bits will be confirmed as error bits. Some will remain suspect because there are plural bits in a column which are suspect. However, each time that an error bit is corrected, it is increasingly likely that a subsequent pass will clear a bit which had remained as a suspect bit. Thus, it is expected that each iterations of steps 170 through 214 has the potential to identify and correct additional error bits until, ideally, all error bits have been corrected and all bad bytes have been cleared. In one aspect, the number of iterations of the process to be performed may be preselected. For example, testing has revealed that a high percentage of errors are corrected after two iterations. In another aspect, a maximum number of iterations may be preselected and the process configured to terminate upon either executing the maximum number of iterations or where repeated iterations are not improving the condition of the data blocks. For example, a count of suspect bits and/or bad bytes may be maintained and the process terminated if one or more iterations are performed but the count of suspect bits and/or bad bytes has not been reduced. In the alternative, the number of corrected bad bytes could be maintained and the process terminated upon correction of a pre-selected percentage of the original number of bad bytes in the data block.

Thus, there has been disclosed and illustrated herein, a method of forward error correction of digital signals which is suitable for use in broadcast routers. It should be clearly understood, however, that while preferred embodiments of this invention have been shown and described herein, various modifications and other changes can be made by one skilled in the art to which the invention pertains without departing from the spirit or teaching of this invention. Accordingly, the scope of protection is not limited to the embodiments described herein, but is only limited by the claims that follow.

The invention claimed is:

1. A method of correcting errors in a data block having N rows and X columns, comprising:
   performing a parity check for each one of said N rows of said data block;
   performing a parity check for each one of said X columns of said data block, the parity check for each of said N rows and said X columns for detecting bit-level errors;
   identifying at least one bad byte for said data block using a byte-level error detection process;
   identifying, from said parity check for each one of said N rows of said data block, from said parity check for each one of said X columns of said data block, and from said at least one identified bad bytes for said data block, at least one error in said data block; and
   correcting said at least one identified error in said data block, wherein:
      the parity check for each one of said N rows of said data block is performed based on a row-based parity encoding that encodes each of said N rows,
      the parity check for each one of said X columns of said data block is performed based on a column-based parity encoding, separate from the row-based parity encoding, that encodes each of said X columns, and
      identifying the at least one bad byte is based on a byte-based encoding that is separate from both the row-based parity encoding and the column-based parity encoding.

2. The method of claim 1, wherein said at least one bad byte for said data block is identified using at least one of an 8B/10B encoding process and an 8B/10B decoding process.

3. The method of claim 2, wherein N equals 32.

4. The method of claim 1, wherein each one of said at least one identified bad byte is located in one of said N rows of said data block.

5. The method of claim 4, wherein identifying at least one error in said data block further comprises:
   identifying at least one suspect bit for each one of said at least one bad byte of said data block, each one of said at least one identified suspect bit being located in one of said X columns of said data block; and
   determining, for each one of said at least one suspect bit, if a parity bit for a corresponding one of said X columns of said data block confirms that said suspect bit is suspect.

6. The method of claim 5, wherein correcting each one of said at least one identified error in said data block further comprises:
   for each confirmed suspect bit, determining if at least one additional bit in said corresponding one of said X columns of said data block is also suspect; and
   if no other bit in said corresponding one of said X columns of said data block is also suspect, correcting said confirmed suspect bit.

7. The method of claim 4, and further comprising identifying at least one suspect bit for each one of said at least one bad byte of said data block, each one of said at least one identified suspect bit being located in one of said X columns of said data block.

8. The method of claim 7, wherein identifying at least one suspect bit for each one of said at least one bad byte for said data block further comprises:
   performing a parity check for each row of said data block in which one or more of said at least one bad byte is located; and
   identifying suspect bits for each said parity checked row;
   wherein said identified suspect bits for said parity checked row are said identified suspect bits for said bad byte.

9. The method of claim 8, wherein identifying at least one error in said data block further comprises:
   identifying at least one suspect bit for each one of said at least one bad byte of said data block, each one of said at least one identified suspect bit being located in one of said X columns of said data block; and
   determining, for each one of said at least one suspect bit, if a parity bit for a corresponding one of said X columns of said data block confirms that said suspect bit is suspect.

10. The method of claim 9, wherein correcting each one of said at least one identified error in said data block further comprises:
   for each confirmed suspect bit, determining if at least one additional bit in said corresponding one of said X columns of said data block is also suspect; and
   if no other bit in said corresponding one of said X columns of said data block is also suspect, correcting said confirmed suspect bit.

11. The method of claim 10, and further comprising:
   for each said corrected suspect bit, correcting said suspect bit of said parity byte for a corresponding row of said data block.

12. The method of claim 1, wherein:
   the row-based parity encoding and the column-based parity encoding are performed prior to the byte-based encoding, and
   the byte-based encoding encodes both the data block and parity bits from the row-based parity encoding and from the column-based parity encoding.

13. The method of claim 1, wherein identifying said at least one error comprises:
   selecting a bit that is in said at least one bad byte;
   determining that the selected bit is indicated as being a suspect bit by at least one of the two parity checks; and
   identifying the selected bit as said at least one error based on the determination that the bit is indicated as a suspect bit.

14. The method of claim 13, wherein identifying said bit that is in said at least one bad byte and that is indicated as being a suspect bit by at least one of the two parity checks comprises identifying a bit that is indicated as being a suspect bit by both of the two parity checks.

15. A method of correcting errors in a data block, comprising:
   (a) identifying at least one suspect bit in said data block, said at least one suspect bit indicating a possible error in said data block;
   (b) classifying said at least one suspect bit as either a confirmed error bit or as an unconfirmed error bit; and (c) correcting said at least one suspect bit if said at least one suspect bit is classified as a confirmed error bit, wherein:

said identifying step identifies said at least one suspect bit using information derived from a byte-level error detection process and information derived front a bit-level error detection process, said byte-level error detection process is based on a byte-based encoding of individual bytes, and said bit-level error detection process is based on a parity encoding, separate from the byte-based encoding.

16. The method of claim 15, and further comprising:
(d) repeating (a) through (C) until all errors in said data block have been corrected.

17. The method of claim 15, wherein identifying at least one suspect bit of said data block further comprises identifying at least one bad byte of said data block using information derived from said 8B/10B encoding of said data block.

18. The method of claim 17, wherein classifying each one of said at least one suspect bit as either a confirmed error bit or as an unconfirmed error bit further comprises:

identifying, using information derived from parity encoding of a row of said data block in which a first one of said at least one bad byte is located, at least one suspect bit for said first one of said at least one bad byte.

19. The method of claim 18, wherein a first one of said at least one suspect bit for said first one of said at least one bad byte is classified as either a confirmed error bit or as an unconfirmed error bit using information derived from parity encoding of a column of said data block in said first suspect bit is located.

20. The method of claim 15, and further comprising the steps of:

applying a pre-selected number of iterations of an error-correction routine to said data block;

said error-correction routine being comprised of (a), (b) and (c).

21. The method of claim 20, wherein said pre-selected number is two.

22. The method of claim 21, wherein said confirmed error bits are identified using a combination of information derived from 8B/10B encoding of said data block, information derived from parity encoding along each row of said data block and information derived from parity encoding along each column of said data block.

23. The method of claim 22, wherein identifying at least one suspect bit of said data block further comprises identifying at least one bad byte of said data block using information derived from said 8B/10B encoding of said data block.

24. The method of claim 23, wherein classifying each one of said at least one suspect bit as either a confirmed error bit or as an unconfirmed error bit further comprises:

identifying, using information derived from parity encoding of a row of said data block in which a first one of said at least one bad byte is located, at least one suspect bit for said first one of said at least one bad byte.

25. The method of claim 24, wherein a first one of said at least one suspect bit for said first one of said at least one bad byte is classified as either a confirmed error bit or as an unconfirmed error bit using information derived from parity encoding of a column of said data block in said first suspect bit is located.

26. The method of claim 15, wherein:

the parity encoding is performed prior to the byte-based encoding, and the byte-based encoding encodes both the data block and parity bits from the parity encoding.

27. The method of claim 15, wherein the parity encoding comprises parity encoding each row of said data block and parity encoding each column of said data block.

28. The method of claim 15, wherein identifying said at least one suspect bit comprises:

determining that a particular bit is identified as a potential error by both the byte-level error detection process and the bit-level error detection process; and identifying the particular bit as said at least one suspect bit based on the determination that the particular bit is identified as a potential error by both the byte-level error detection process and the bit-level error detection process.

29. The method of claim 15, wherein identifying said at least one suspect bit in said data block comprises:

(d) identifying all suspect bits in said data block, and the method further comprises:

performing (b) and (c) for all identified suspect bits in said data block; and iterating by performing (d), (b), and (c) repeatedly until a stopping condition is satisfied.

30. The method of claim 29, wherein the stopping condition comprises one or more of (1) iterating a preselected number of times, (2) iterating until there are no more suspect bits, and (3) iterating until a preselected percentage of errors are corrected.

* * * * *